United States Patent
Greimel-Rechling et al.

(10) Patent No.: US 12,136,935 B2
(45) Date of Patent: Nov. 5, 2024

(54) LOSSLESS DATA TRANSFER COMPRESSION

(71) Applicant: ams AG, Premstätten (AT)

(72) Inventors: Bernhard Greimel-Rechling, Hofstätten an der Raab (AT); Joachim Lechner, St. Margarethen an der Raab (AT); Herbert Lenhard, Graz (AT); Philipp Dunst, Graz (AT)

(73) Assignee: AMS AG, Premstätten (AT)

( * ) Notice: Subject to any disclaimer, the term of this patent is extended or adjusted under 35 U.S.C. 154(b) by 146 days.

(21) Appl. No.: 17/788,167

(22) PCT Filed: Dec. 16, 2020

(86) PCT No.: PCT/EP2020/086530
§ 371 (c)(1),
(2) Date: Jun. 22, 2022

(87) PCT Pub. No.: WO2021/130086
PCT Pub. Date: Jul. 1, 2021

(65) Prior Publication Data
US 2023/0074041 A1    Mar. 9, 2023

Related U.S. Application Data

(60) Provisional application No. 62/953,092, filed on Dec. 23, 2019.

(51) Int. Cl.
*H03M 7/30*     (2006.01)
*G06F 13/42*    (2006.01)
*G06F 3/06*     (2006.01)

(52) U.S. Cl.
CPC ...... *H03M 7/6005* (2013.01); *G06F 13/4282* (2013.01); *H03M 7/3062* (2013.01); *G06F 3/065* (2013.01); *G06F 3/068* (2013.01); *H03M 7/3059* (2013.01)

(58) Field of Classification Search
CPC ............ H03M 7/6005; H03M 7/3062; H03M 7/3059; G06F 13/4282; G06F 3/065; G06F 3/068
See application file for complete search history.

(56) References Cited

U.S. PATENT DOCUMENTS

| | | |
|---|---|---|
| 6,862,278 B1 | 3/2005 | Chang et al. |
| 2010/0128949 A1 | 5/2010 | Wegener et al. |
| 2018/0167083 A1* | 6/2018 | Dubey ................ H03M 7/6076 |

OTHER PUBLICATIONS

Belardinelli, Carlo (EP Authorized Officer), International Search Report and Written Opinion in corresponding International Application No. PCT/EP2020/086530 mailed on Apr. 6, 2021, 12 pages.

* cited by examiner

*Primary Examiner* — Joseph J Lauture
(74) *Attorney, Agent, or Firm* — MH2 Technology Law Group LLP

(57) ABSTRACT

We disclose herein a method of compressing data for data transfer within an electronic device. The method comprises: receiving, at a first processing member of the electronic device, a plurality of data samples produced by a member of the electronic device, wherein the data samples comprise numerical bits; restructuring, by the first processing member, the plurality of data samples into a plurality of data packets; labelling each data packet with a sample indicator bit to indicate a plurality of groups across the plurality of data packets; transferring a bit stream comprising at least some of the plurality of data packets across an interface of the electronic device to a receiving member of the electronic device; and decoding the bit stream, by a second processing member of the electronic device, to obtain at least some of the plurality of the data samples, the decoding being based at least in part on the sample indicator bits.

20 Claims, 5 Drawing Sheets

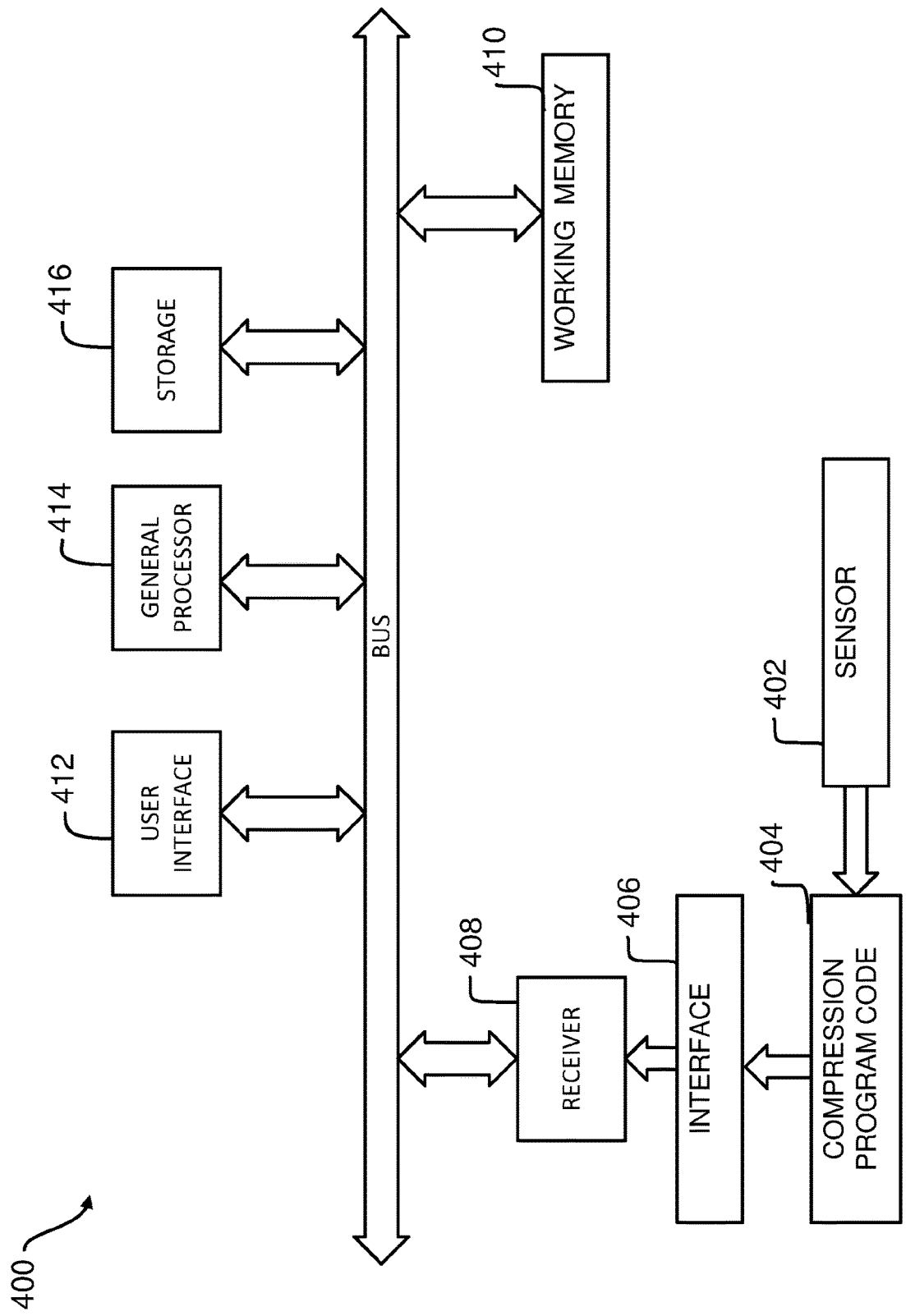

LOSSLESS DATA TRANSFER COMPRESSION

CROSS-REFERENCE TO RELATED APPLICATIONS

The present application is the national stage entry of International Patent Application No. PCT/EP2020/086530, filed on Dec. 16, 2020, and published as WO 2021/130086 A1 on Jul. 1, 2021, which claims the benefit of priority of U.S. Provisional Application No. 62/953,092, filed on Dec. 23, 2019, all of which are incorporated by reference herein in their entireties.

BACKGROUND

The present disclosure relates to data compression techniques.

Electronic device such as mobile device typically comprise screens having adjustable brightness. Automatic adjustment of the screen brightness may be facilitated with the use of devices an ambient light sensor (ALS). An ALS performs the function of adjusting the screen brightness to the surrounding lighting environment to both make the display look sharp and readable while also reducing the display's overall energy consumption.

Data transfer in electronic devices for data obtained from ALS sensors is typically done via an I²C interface. As development of electronic devices has progressed, sampling rates of ALS sensors has increased, for example in order to quickly detect changes in lighting conditions.

An increased sampling rate increases the amount of ALS data which must traverse through the I²C. As the amount of data increases, there is an increased likelihood that the I²C bus interface may become backlogged with data. This effect may therefore constrain the sampling rate of an ALS sensor in order that it does not overload the I²C with sensor data. An increase in the amount of data, or the efficiency by which data can be transferred, through the I²C interface would enable an increase in the sampling rate of an ALS sensor in an electronic device.

Known art includes US 2019/101442, 'METHOD OF AMBIENT LUMINOSITY LEVEL DETECTION, AND CORRESPONDING SENSOR', which relates to resetting and triggering a counter each time a photodiode illuminated by an ambient luminous radiation reaches a discharge threshold.

SUMMARY

In addition to providing lossless data compression, embodiments of the present disclosure provide for an algorithm having an uncomplicated implementation. This is advantageous because, in embodiments, the algorithm is implemented in hardware of an electronic device and can execute quickly enough to meet the demands of the sampling rate of a measurement sensor. In other words, in addition to providing an improved degree of data compression, the compression algorithm itself can be executed efficiently in order to compress a high throughput of data which meets the demands of the sensor. In this way, existing hardware and interfaces on electronic devices can be maintained/reused with e.g. improved sensors having higher sampling rates.

According to one aspect of the present disclosure, there is provided a method of compressing data for data transfer within an electronic device, the method comprising: receiving, at a first processing member of the electronic device, a plurality of data samples produced by a member of the electronic device, wherein the data samples comprise numerical bits;
restructuring, by the first processing member, the plurality of data samples into a plurality of data packets;
labelling each data packet with a sample indicator bit to indicate a plurality of groups across the plurality of data packets;
transferring a bit stream comprising at least some of the plurality of data packets across an interface of the electronic device to a receiving member of the electronic device;
decoding the bit stream, by a second processing member of the electronic device, to obtain at least some of the plurality of the data samples, the decoding being based at least in part on the sample indicator bits.

Indicator bits may be chosen such that each group of data packets (where each group may belong to the same data sample) contain the same/matching indicator bit. The defined size of data packet may be same for each packet, or, the defined size may be dynamically changed according to the history of data sample sizes. Alternatively, the defined packet sized may be predetermined such that it changes regularly according to a predefined sequence. It will be appreciated that the sample indicator may not correspond to 1 bit.

The restructuring of data samples into data packets may occur in an order which reflects the order in which the data samples were received. In this way, the same order of samples, and bits within samples, is maintained throughout the transfer such that the original order of data samples may be obtained by the receiver.

This aspect of data compression thus reduces the amount of data transferred over the interface/bus. This provides the advantage that the interface, which may be a serial or parallel interface (for example I²C), can be maintained in the architecture of existing devices. This means, for example, no additional pins or other modifications are required to existing device architecture. In other words, no hardware modification is required to increase a throughput capacity of the interface; instead, the efficiency with which the information itself is transferred is improved. Indeed, it is a surprising result of embodiments within the present disclosure, that an algorithm having uncomplicated implementation procedure (especially relative to known compression methods) can provide compression ratios of over a factor of two.

Yet further, the above compression method reduces the number of bits such that the transfer of information inherently results in a reduction of bus power consumption.

Each group of the plurality of groups may correspond to a different respective data sample.

The decoding may include:
identifying, based on the sample indicator bits, the plurality of groups of data packets representing the different respective data samples;
removing the sample indicator bit from each data packet in order to obtain the plurality of data samples received originally from the member.

Hence, the indicators allow the receiver member to re-organize the bit stream into data packets, group the data packets the correct data samples from which the data packets originated, and remove the indicator bits in order to obtain the data samples. Alternatively, the receiver may not partition the bit stream into packets. The receiver member may simply organize the bit stream directly into the groups representing the data samples, and subsequently remove the sample indicator bit.

The method may further include:
prior to the restructuring, calculating numerical differences between each pair of adjacent data samples to obtain a plurality of difference values;
restructuring, by the first processing member, the plurality of difference values instead of the data samples to obtain the plurality of data packets.

Advantageously, calculating the difference prior to structuring the samples into packs and transferring them can offset any data samples having higher values (which require a larger number of bits to fully represent them). Therefore, calculating the difference between adjacent data samples can provide surprisingly large efficiency saving, for example where a sequence of consecutive data samples have very similar values. Thus, the relative differences between each pair of adjacent values can be represented by much smaller number than the value of the original data sample.

Further, any negative difference value may be represented in binary two's complement representation. Advantageously, a two's complement representation is an inherently efficient way of storing and transferring negative numbers, because a two's complement representation does not contain a dedicated 'sign' bit. Instead, the first bit of a two's complement representation uses the first bit (i.e., the 'most significant bit') to denote both the sign, and part of the value, of the number represented.

The restructuring may include, for each data sample: partitioning the numerical bits of the data sample into the fewest number of data packets required to represent information comprised in said data sample.

In this way, any 'zero' bits which precede the most significant bit in the data sample number can be removed, and are not transferred as part of the bit stream. In other words. Beneficially, nevertheless, all bits that contain information about the value of the data sample are transferred; thus, the compression method is lossless. For example, a set of data samples may all be received at the first processing member in an 8-bit format. However, the set of data samples may each represent values of less than 63, and therefore needs at most 6 bits to represent the number. Thus, a defined packet size of 6 may be used.

Each data packet of the plurality of data packets may have a defined size.

The method may further include:
monitoring, by any one of the first processing member, second processing member, and receiving member of the electronic device, the restructuring of data samples into data packets to obtain an average number of data packets per data sample;
dynamically setting the defined size of the plurality of data packets based on the average number of data packets per data sample.

In this way, the receiver or transmitter (i.e. the first processing member) can monitor the history of the receiver data samples to determine an average needed number of data packets used. Therefore, the defined size of the data packets can be dynamically changed in order to efficiently transfer the information within the data samples. Advantageously, as mentioned before, any unnecessary 'zero' bits which precede the most significant bit in the data sample number, and which carry no information, can be removed in the data packets.

The data samples may be representative of signals measured by a sensor member of the electronic device.

The sensor member is an ambient light sensor.

The above algorithm provides advantageous results for data obtained from an ambient light sensor (ALS), and in particular an ALS sensor used to monitor flicker of an ambient light source.

The member of the electronic device may comprise a set of data channels which each produce a channel-specific data sample.

The method may further include: receiving the plurality of data samples produced by the set of data channels of the member; restructuring, by the first processing member, the plurality of data samples to obtain the plurality of data packets, the restructuring comprising for each data sample: restructuring said data sample into at least one data packet, wherein the at least one data packet has a defined size corresponding to a data channel of the set of data channels which produced said data sample.

In order to minimise wasted 'zero' bits which carry no information, a different defined packet size can be adopted for each channel. For example, different channels may collect data (such as ambient light data) to a different degree of precision. Therefore, different packet sizes would be best suited to transfer the data samples for each channels most efficiently.

The indicator bits may be chosen such that a first data packet of each group of data packets has a first indicator bit (e.g. a one), and all other data packets have a second, different, indicator bit (e.g. a zero).

The sample indicator may be inserted at a defined location within the data packet.

The labelling may further include inserting the sample indicator into each data packet at a predefined location, where said predefined location changes according to a predefined sequence of locations.

Advantageously, by inserting the indicator bit at a varying set of locations/bit positions within the data packet, the bit stream becomes increasingly hard to interpret or reverse engineer without prior knowledge of the defined sequence. Further, a degree of encryption can be inserted into the data in order to protect the information the bit stream represents.

The interface of the electronic device may be a serial peripheral interface.

The interface of the electronic device may be an I$^2$C interface.

Advantageously, existing technology containing existing serial peripheral or I$^2$C interfaces can be used in an unmodified form to transfer information at a higher level of efficiency, due to the compression obtainable by examples of the described compression method.

Each data sample may be represented in binary.

Each data sample having a negative value may be represented in two's complement binary form.

The first processing member may be a hardware element comprising a persistent configuration enabling said hardware element to carry out the restructuring and labelling.

A non-transitory data carrier carrying processor control code to, when running, implement the decoding described above.

According to a further aspect of the present disclosure, there is provided an apparatus comprising: a member configured to produce data samples; a first processing member, configured to receive a plurality of data samples produced by a member of the electronic device, wherein the data samples comprise numerical bits. The apparatus also includes an interface coupled to the first processing member and a receiving member. The first processing member is further configured to: restructure the plurality of data samples into a plurality of data packets; label each data packet with a sample indicator bit to indicate a plurality of groups across the plurality of data packets; transfer a bit stream comprising at least some of the plurality of data packets across the interface to the receiving member; a second processing member configured to decode the bit stream to obtain at least some of the plurality of the data samples, the decoding being based at least in part on the sample indicator bits.

BRIEF DESCRIPTION OF THE DRAWINGS

Embodiments of the present disclosure are illustrated in the following figures, in which:

FIG. 4 shows a diagram representing a general electronic device configured or programmed to implement the procedure of FIGS. 1-3; and

DETAILED DESCRIPTION

Figure 1:
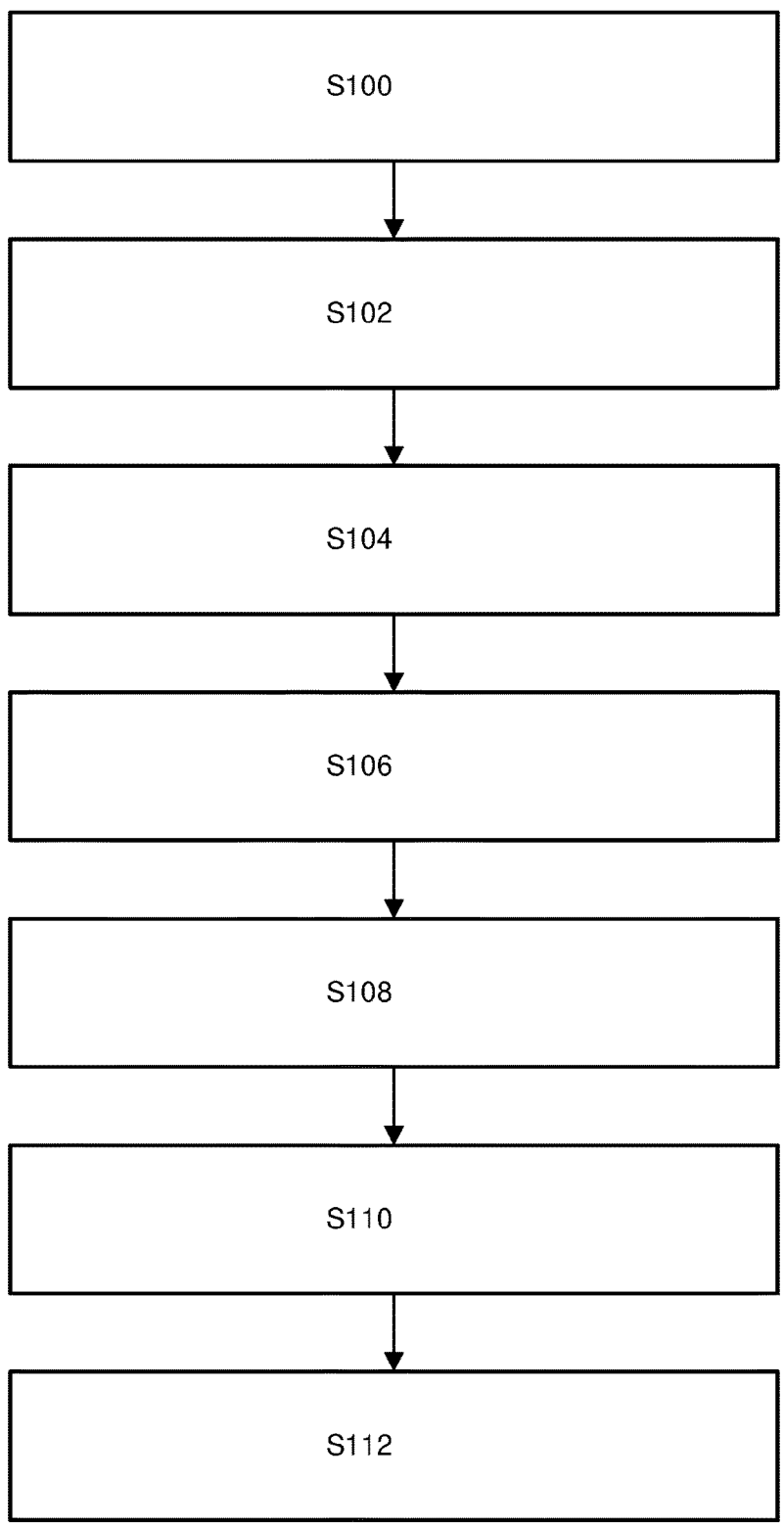
FIG. 1 shows an example method of data compression and transfer.

The present disclosure relates in particular to lossless data compression for the efficient transfer of data obtained from ambient light sensors (ALS) in electronic devices.

It is known that an ALS is sensitive to the flicker inherent in artificial light sources powered by an AC source. The sampling rate of an ALS affects the sensitivity of the ALS to flicker. For example, an ALS may not be able to sample at a high enough rate to account for the flicker of an artificial light source, which may result in an erroneous determination of ambient light levels.

Therefore, suitable electronic devices may be equipped to detect and mitigate against flicker in ambient light sources. For example, an ALS may be employed at a higher sampling rate, which would allow other algorithms within the electronic device to more accurately mitigate for flicker, and determine an accurate average for ambient light conditions. The configuration of an ALS within a device may also create a dependence on the rate of sampling needed for accurate determination of ambient light conditions. For example, an ALS sensor disposed behind a screen of an electronic device requires an increased sampling rate.

However, the sampling rate for an ALS is proportional to the amount of traffic being transmitted through the electronic devices transfer bus, which may be a serial bus, for example an I²C bus. This can result in data transfer bottleneck at the bus.

Known compression algorithms include Lempel-Ziv-Welch (LZW) and adaptive Huffman. However, these algorithms require complex implementation, which generally renders them unsuitable for use in ALS-flicker data transfer. Therefore, it is not known in the art to provide a method of lossless data compression in conjunction with ALS flicker detection.

The present disclosure introduces a method to reduce the traffic by around a factor of 2, or even more, compared to known implementations. Nevertheless, embodiments pertaining to the present disclosure are not limited to the transfer of data obtained by an ALS sensor, or data in relation to an increased sampling rate to allow for flicker detection. Therefore, it will be appreciated that the present method is not restricted to flicker detection, and can be used in various scenarios where data needs to be transferred via a serial or parallel bus.

ALS flicker data may be transferred without compression in an 8 bit or 16 bit mode via I²C. The bit-size also varies depending on measurement time. For higher flicker frequency support, the sampling rate is and/or the dynamic range is increased, which leads to a higher I²C traffic. For example, a 4 kHz sampling rate at 10 bit resolution sampled over 100 ms (10 Hz bin distance) generates 3.2 k bits which is transferred via I²C. Using currently existing 8 or 16 bit-orientated FIFO (first-in, first-out) architecture would require needs 400 byte for 8 bit and 800 byte for 16 bit data transfer.

Algorithms according to embodiments of this disclosure can reduce the I²C traffic such that the transferred bytes will be in the range of 350 bytes, compared to 800 bytes without losing information. Advantageously, the reduced interface load enables the transfer of more data with the existing bus topology within current electronic devices. Therefore, only a change in software implementation needs to be applied to an electronic device, without a need to redesign the architecture of electronic devices.

It will be appreciated that the compression algorithm may be implemented in hardware or software of the electronic device. For example, the algorithm may be hardcoded within the electronic device on a chip such as an FPGA (field programmable gate array) or ASIC (Application-specific integrated circuit). Hardware-implement algorithms may run most efficiently, which would be beneficial for executing quickly enough to meet the demands of a sensor's sampling rate. Hardware-executable code may also provide a level of parallelisation that is not as accessible on a software-implemented algorithm.

Example 1: Compression

FIG. 1 illustrates a flowchart representing a series of steps involved in the compression algorithm, which may in embodiments relate to data used for flicker detection of an ALS sensor. The data compression method is sufficiently general, however, that it is applicable to the compression and transfer of various data types, and not necessarily pertaining to sensor data. Moreover, the algorithm is sufficiently general that it may be applied for the transfer across any appropriate serial or parallel bus. Merely by way of example and for convenience, FIG. 1 is described in relation to sensor data.

S100—receive RAW data comprising data words representing measured sensor values. According to step S100, raw data is received from a sensor in an electronic device. The data may take the form of a sequence of numbers. The numbers may represent some unit or indication of ambient light intensity, for example, or any number of quantities which may be measured by a sensor. Each number is referred to as a data word. The data word may be represented as a binary number, however, any numerical base system may be use by the underlying software or hardware.

S102—restructure the data words into packets having a fixed size of n−1 bits. In step S102, each data word is partitioned, or restructured, into separate packets. The size of the packets is preferably measured in bits. The packet size may be predetermined, for example containing n−1 bits. Merely for example, packet sizes of n−1 bits may be used, e.g. where n=6. Therefore, a data word consisting of 10 bits will be partitioned into 2 packets. A different data word consisting of 11 bits would be partitioned into 3 packets.

Alternatively, the packet size may be dynamically chosen depending on the size of the data words being received from the sensor. For example, if data words consisting of 11 or 12 bits were frequently received from the sensor, the algorithm may determine that it would be more efficient to partition/restructure the data words into two packets with a 6-bit size, as opposed to three packets with a 5-bit size. In this way, fewer zeros (representing no useful information from the sensor) are transmitted, and a higher degree of compression can be obtained.

S104—insert an indicator bit within each packet at a fixed position to obtain packets of size n bits, where the indicator bit identifies different data words. In more detail, at step S104, an indicator bit is added to a predetermined position within the packet. The indicator bit is used to identify different data words. In other words, the indicator bit is used to mark the beginning of a new data word. An indicator bit may be a zero or a one, however, in alternate embodiments where packets are not represented in binary may be any number. Seen another way, the sample indicator bit toggles with the transferred data words. The data word length is flexible and non-fixed, and depends on the magnitude of the numbers being received from the sensor. All packets in a data word have the same sample indicator bit-position. For example, the indicator bit (e.g. a zero or one) may be inserted as a prefix to the packets, or appended as a suffix. The packet size is now n bits.

Table 1 below illustrates an example with a defined packet size of n=6, after the indicator bit has been added.

| Example packet size 6 | | | | | |
|---|---|---|---|---|---|
| Sample Indicator | Bit4 | Bit3 | Bit2 | Bit1 | Bit0 |
| 5 | 4 | 3 | 2 | 1 | 0 |
| | | Bit | | | |

Table 2 below illustrates an example with a defined packet size of n=7, after the indicator bit has been added.

| Example packet size 7 | | | | | | |
|---|---|---|---|---|---|---|
| Sample indicator | Bit5 | Bit4 | Bit3 | Bit2 | Bit1 | Bit0 |
| 6 | 5 | 4 | 3 | 2 | 1 | 0 |
| | | | Bit | | | |

With this mechanism, after the bit stream has been transferred, the receiver can identify the beginning/ending of each data word. Removing the single bit representing the indicator bit and merging the bits up to the next indicator change reconstructs the transferred data word.

S106—transfer the packets as a bit stream of data to a receiver. In step S106, the data packets are transferred as a stream of bits, which may e.g. be a continuous (uninterrupted) stream of bits.

S108—demerge bit stream into individual packets. In step S108, the bit stream it partitioned or divided up into packets of the predetermined length, e.g. 6. Therefore, when the receiver is aware of the predetermined packet size, the bit stream is restructured/partitioned into a new packet every $n^{th}$ Bit.

S110—allocate packets to their respective data words based on the indicator bit. At step S110, the receiver determines which packets belong to the same data word by reading the indicator bit at the predetermined position within the packets. For example, the indicator bit may be the first bit in each packet, and an indicator bit of '1' may represent the start of the new data word. Thus, an indicator bit of '0' may represent a middle or end portion of a data word. The packets are then allocated into their respective data words. The order of the data words and packets is maintained throughout steps S100 to S110, therefore no sorting or re-ordering of packets is required.

S112—remove indicator bit from packets to obtain original RAW data. At step S112, once the packets have been allocated to their respective data words, the indicator bits are removed from each packet. Thus, the originally raw data received from the sensor is obtained by the receiver.

The steps of the described algorithm and FIG. 1 are further described in Table 3 below.

| | | | | Decimal Value |
|---|---|---|---|---|
| S100-Receive data words | | | | |
| Data word 1 | 00101 11011 11001 10100 | | | 192308 |
| Data word 2 | 00000 00000 00110 00110 | | | −58 (two's complement) |
| Data word x | 00000 00000 00000 00000 | | | 0 |
| S102-Partition data words in packets of size n − 1 (n = 6) | | | | |
| Data word 1 | 00101 | 11011 | 11001 | 10100 |
| Data word 2 | | | 00110 | 00110 |
| Data word x | | | | 00000 |
| S104-Insert Indicator bit as the first bit to each packet | | | | |
| Data word 1 | 100101 | 011011 | 011001 | 010100 |
| Data word 2 | | | 100110 | 000110 |
| Data word x | | | | 100000 |
| S106-Transfer buffer (FIFO) bit stream | | | | |

100101011011011001010100100110000110100000

|  | Decimal Value |
|---|---|
| S108-Receive and demerge bit stream into packets of size n | |

| | | | | | | |
|---|---|---|---|---|---|---|
| 1̲00101 | 0̲11011 | 0̲11001 | 0̲10100 | 100110 | 0̲00110 | 1̲00000 |

S110-Allocate packets into respective data words using indicator bit

| | | | | | |
|---|---|---|---|---|---|
| Data word 1 | 1̲00101 | 0̲11011 | 0̲11001 | 0̲10100 | |
| Data word 2 | | | 1̲00110 | 0̲00110 | |
| Data word x | | | | 1̲00000 | |

S112-remove sample indicator from packets

| | | | | | |
|---|---|---|---|---|---|
| Data word 1 | 00101 | 11011 | 11001 | 10100 | 192308 |
| Data word 2 | | | 00110 | 00110 | −58 (two's complement) |
| Data word x | | | | 00000 | 0 |

The underlined digits in the table 3 above represent the indicator bits.

In addition to the above described embodiments, further optional elements can be included into the algorithm in order to obtain a further degree of compression. For example, the algorithm can allow that only positive data samples are transferred. This carries the advantage that no 'sign bit' needs to be transferred, and thus reduces the numbers of bits transferred.

Alternatively, both positive and negative data samples can be transferred in two's complement representation. In this way, the overall number of bits transferred are reduced, as two-complement has to potential to be a more memory-efficient way of representing binary numbers. When two's complement representation is used to represent both negative and positive numbers, the difference is the sign bit (0 in case of positive numbers 1 in case of negative numbers) and in case of transferring differences, this representation is generally used.

In yet a further alternative example, the receiver and/or transmitter can monitor the average needed number of packets for single data words, and automatically/dynamically adapt the packet size to an optimum. As mentioned above, the dynamic packet size may be chosen in order to minimize the number of zeros used as the first series of digits of binary numbers (which therefore carry no information on the magnitude of the sample).

Example 2: Delta Compression

In other example implementations, instead of transferring the RAW data, the difference (or delta) between adjacent values may instead be transferred. Once received, the original set of values can be calculated based on the differences and value of the first data word. In this way, advantageously, the amount of data transferred can be substantially reduced depending on the relative values of the data words. For example, where the data words represent large numbers, and a series of consecutive data words have the same value, the difference of said consecutive data words will be zero and may thus be represented in as few as 1 bit. This carries the benefit of being a lossless data compression method. Negative numbers may be represented in two's complement representation in this algorithm. Using the delta approach, a further improved compression ratio can be achieved for data related to ALS flicker-detection data.

Figure 2A:
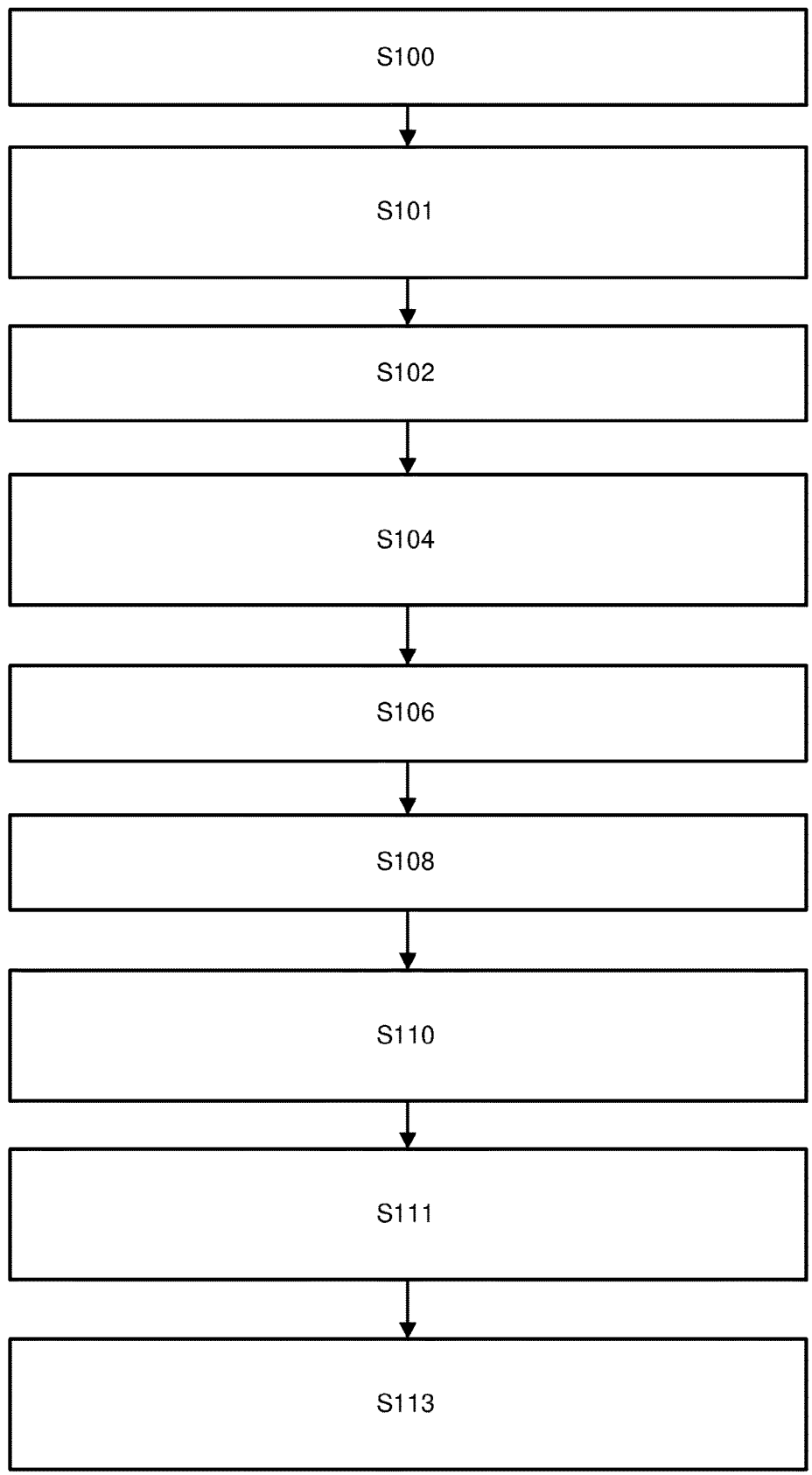
FIG. 2a shows a further example of data compression and transfer where the delta of adjacent data values is transferred.

FIG. 2a shows an example flowchart representing a series of steps involved in the compression algorithm that further processes the sensor data to transmit only the differences between successive adjacent data words. The steps of FIG. 2a are described below.

S100—receive RAW data comprising data words representing measured sensor values;

S101—calculate the difference between each successive adjacent number (data word), and store the difference in place of the original data word in binary, optionally in binary two's complement representation;

S102—restructure the data words into packets having a fixed size of n−1 bits;

S104—insert an indicator bit within each packet at a fixed position to obtain packets of size n bits, where the indicator bit identifies different data words;

S106—transfer the packets as a bit stream of data to a receiver;

S108—demerge bit stream into individual packets;

S110—allocate packets to their respective data words based on the indicator bit;

S111—remove indicator bit from packets to obtain the calculated differences in binary representation;

S113—add the differences to the first data word, successively for each data word, to obtain original RAW data;

In addition to the steps shown in FIG. 1, FIG. 2a illustrates S101 in which the differences, or deltas, between successively adjacent numbers is calculated. Each original data word is then replaced with the difference calculated between said data word and the immediately preceding data word. Therefore, the first data ford in the sequence is maintained, in order that the full set of data words can be re-calculated once the deltas have been transferred. Optionally, for a further efficiency saving, the negative numbers (and optionally the positive numbers) can be represented in binary two's complement representation.

The Delta compression algorithm comprises the further step S111 of removing the indictor bit from the delta numbers. Subsequently, in order to obtain the original sensor-measured data word values, at step S113 the difference values must be added successively to the first data word in order to obtain the original values.

TABLE 4 below shows an example of a series of data words having the Delta compression algorithm applied prior to being transferred. The packet size is for example 6.

| $N^{th}$ data word | Data word | Delta | Indicator bit | Binary representation (two's complement) | Packet 1 | Packet 0 |
|---|---|---|---|---|---|---|
| 0  | —   | —   | — | —            | —      | —      |
| 1  | 338 | 338 | 0 | 0101010010   | 001010 | 010010 |
| 2  | 346 | 8   | 1 | 0000001000   |        | 101000 |
| 3  | 340 | −6  | 0 | 1111111010   |        | 011010 |
| 4  | 337 | −3  | 1 | 1111111101   |        | 111101 |
| 5  | 330 | −7  | 0 | 1111111001   |        | 011001 |
| 6  | 325 | −5  | 1 | 1111111011   |        | 111011 |
| 7  | 328 | 3   | 0 | 0000000011   |        | 000011 |
| 8  | 332 | 4   | 1 | 0000000100   |        | 100100 |
| 9  | 339 | 7   | 0 | 0000000111   |        | 000111 |
| 10 | 345 | 6   | 1 | 0000000110   |        | 100110 |
| 11 | 250 | −95 | 0 | 1110100001   | 011101 | 000001 |
| 12 | 250 | 0   | 1 | 0000000000   |        | 100000 |
| 13 | 250 | 0   | 0 | 0000000000   |        | 000000 |
| 14 | 350 | 100 | 1 | 0001100100   | 100011 | 100100 |
| 15 | 350 | 0   | 0 | 0000000000   |        | 000000 |
| 16 | 350 | 0   | 1 | 0000000000   |        | 100000 |
| 17 | 10  | −340| 0 | 1010101100   | 010101 | 001100 |
| 18 | 10  | 0   | 1 | 0000000000   |        | 100000 |
| 19 | 10  | 0   | 0 | 0000000000   |        | 000000 |
| 20 | 10  | 0   | 1 | 0000000000   |        | 100000 |

The underlined digits in the table 4 above represent the indicator bits.
The bold italic digits represent the sign bit of the two's complement numbers.

Figure 2B:
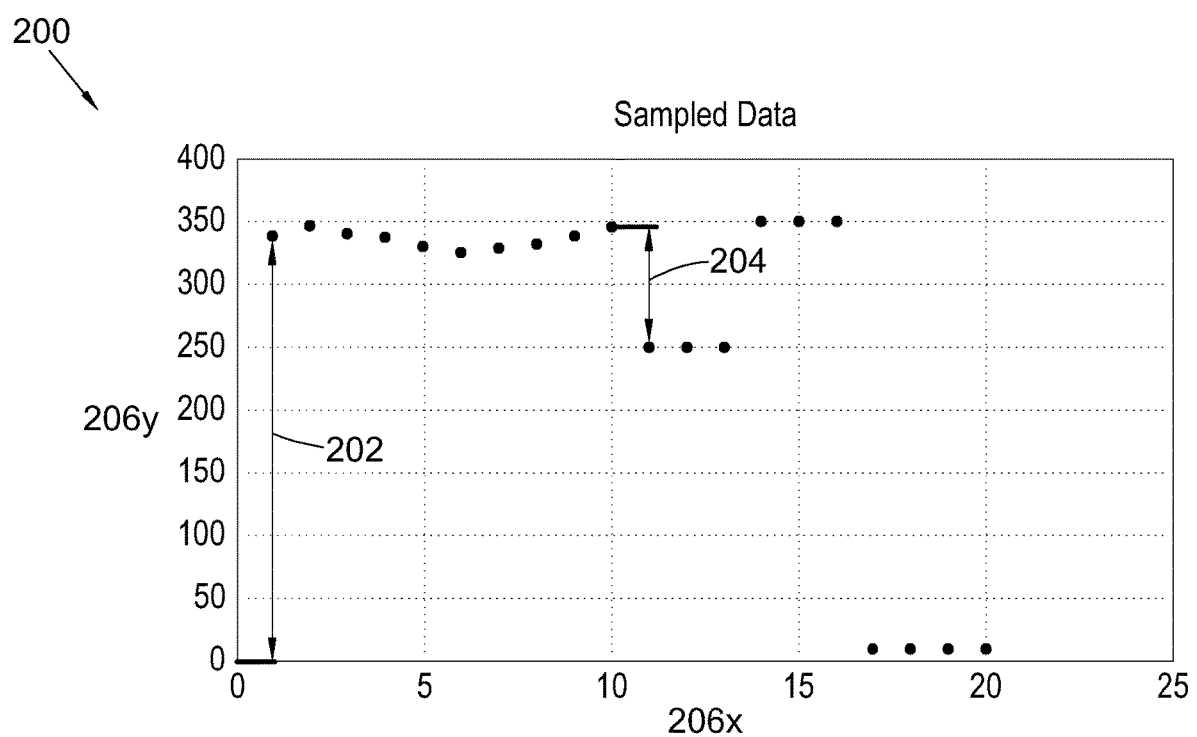
FIG. 2b illustrates example data processed according to FIG. 2a, and as shown in table 3.

FIG. 2*b* shows a graph 200 of the original data word values. The deltas between various adjacent data words are illustrated. For example, the delta 202 between the zeroth data word $n_0=0$, and the second data word $n_1=338$, gives a delta of $D_{0,1}=338$. The delta 204 between $n_{10}=345$ and $n_{11}=250$ gives a delta of $D_{10,11}=n_{11}-n_{10}=-95$. The axes represent the data word number 206*x*, and the data word's numerical value (in decimal) 206*y*.

The two's complement representation is advantageous because it is a more storage-efficient way of representing negative numbers in binary, and thus results in more efficient data transfer. It will nevertheless be appreciated that the above method is not limited to a two's complement binary representation, and any suitable representation of the Delta value may be used.

It will be appreciated that with two's complement the range for representable differences is "halved". For example, if there are 10 bits at maximum to represent for each value, then the representable range for unsigned numbers is from 0-1023. In case of two's complement representation with 10 bits, there is a range from −512 to 511 (each bit position has a weight of 2^position, except the sign bit with has a value of −2^position, e.g. (−2^9, . . . , 2^3, 2^2, 2^1, 2^0)= −512, . . . , 8, 4, 2, 1). In case there are two sequential values of 1000 and 20, and there is a desire to transfer the difference, the result would be −980. It would use 11 bits to represent this difference in two's complement scheme. It will be appreciated that, in a scenario, when there are 10 bits at maximum, then it is possible to use the nature of range wrapping in the following way. One would use the wrapping over 10 bits. That is mod (1000+k,2^10)=20 then k=23+ 20=44, or written differently 20−1000+2^10=−980+ 1024=44. So instead of transferring −980 (11 bit in two's complement b10000101100=−1024+32+8+4=−980) it is possible to also transfer 44 (7 bits in two's complement b0101100=44=32+8+4). To restore the correct value one need to simply calculate mod (1000+44, 2^10)=20. Generally speaking, the same is true in the opposite direction e.g. going from 12 to 900=> The difference is +888 which it is not possible to represent with a 10 bit two's complement value. When calculating 900−12−2^10=888−1024=−136.

For representable values the modulo operation is also useful, e.g. going from 500 to 100 results in−400=>mod (500−400,2^10)=100. Therefore the modulo operation can be applied when decoding. This method can be adapted accordingly if the overall representation range is not 10 bits but any other number of bits. The skilled person would appreciate that the above examples are applicable to the inventive concept of the present disclosure.

According the above specific example in Table 4, if the data were to be transferred the following compression factor would be achieved:

Conventional data transfer:
16 Bit FIFO Mode→20 x2 Byte=<u>40</u> Byte total.

Data transfer for the Table 4 example using Delta compression:
Data compression with two's complement and defined packets size (6 bits)→24 x6 Bit/8=<u>18</u> Byte total
Achieved compression ratio:
40 byte: 18 byte→2.22:1 ratio.

Therefore, a compression factor over 2 is achieved using transferring the two's complement representation of the difference between adjacent data word values. Moreover, the above implementation maintains the exact input data, and thus the compression is lossless. Similarly to the first example, dynamic packet size can also be implemented, e.g. based on the packet history. In this way, a packet size can be chosen such that 'wasted' zeros which precede the packet values are minimized, such that as many digits as possible of each packet convey information about the underlying data word value. It would be appreciated that when there are two's complement it is possible to waste 1's as well.

Example 3: Compression with Multiple Channels

As mentioned above, data words may be received from channels having a particular bit width. It may be advantageous to maintain the bit width of the received data word in the packet, or it may alternatively be more efficient to dynamically re-size the width of the packets in order to most efficiently transfer the information contained in the data words.

In alternative examples, a sensor may contain multiple channels, for example each having a different sensitivity or each disposed to measure a particular range within the spectrum of ambient light. Therefore, sets of data words may be measured by the sensor, where each data word within a set is of a different bit width. In such a scenario, the compression algorithm uses indicator bits to toggle between consecutive data of difference widths.

Merely for example, a sensor may deliver data words in three channels of the following bit widths:

TABLE 5

| Channels | Bit width table |
|---|---|
| Channel 1 | 4 |
| Channel 2 | 9 |
| Channel 3 | 6 |

The following data words example may be received from the sensor, which are divided into packets based on bit width table of the channels. In this way, the bit width of each channel is pre-determined, and the packet sizes are fixed.

TABLE 6

| Channels | Data Word | Packet 2 | Packet 1 | Packet 0 |
|---|---|---|---|---|
| Channel 1 | 110 | — | | 1110 |
| Channel 2 | 110011100110 | | 100001100 | 011100110 |
| Channel 3 | 1100110011 | | 111001 | 010011 |

Again, the underlined digits represent the indicator bits. The bit stream transfer, e.g. using the FIFO protocol, is a concatenation of the above packets, with added indicator bits:

1110010100111000011000111001101110

The indicator bits represent the beginning of a new data word in the same manner as previously described. In addition, the indicator bits also indicate that a new packet width is to be used. The receiver, which receives the transmitted bit stream above, is in possession of the information about the various channels and their respective bit widths. The receiver also knows the order of the respective channels.

The receiver can only read zeros and ones, however, and cannot immediately distinguish an indicator bit from an information bit. The receiver instead identifies which bit is the indicator bit on the basis of a predefined location of the indicator bit within each packet.

Therefore, in the multi-channel example, the receiver is programmed to read every $n^{th}$ bit as an indicator bit, where n is also programmed to change each time a new data word is found, in accordance with the order of the three channels. This is further illustrate below:

$$\underbrace{110001}_{n=6} \underbrace{010011}_{n=6} \underbrace{100001100}_{n=9} \underbrace{011100110}_{n=9} \underbrace{1110}_{n=4}$$

For example, the receiver may be programmed to begin reading the stream in units of six bits. The second packet of six in the above stream begin with a zero. This zero is hence read as the indicator bit, which indicates i) that the following bits are part of the same data word as the preceding packet, and ii) that the present packet has a bit width of six. The beginning of the next packet, which is read as the indicator bit, begins with a 1. Therefore, this indicates a bit width change of the next packet. The table indicates that the packet width has changed from 6→9. From that point onwards, the bit stream is read in units of nine bits, until an indicator bit is read which is a '1'. The next '1' indicates that the bit width should be changed again (the last four digits of the above bit stream), from a bit width of 9→4. When the next data word is identified, the receiver loops back to using the bit width of the first channel.

Figure 3:
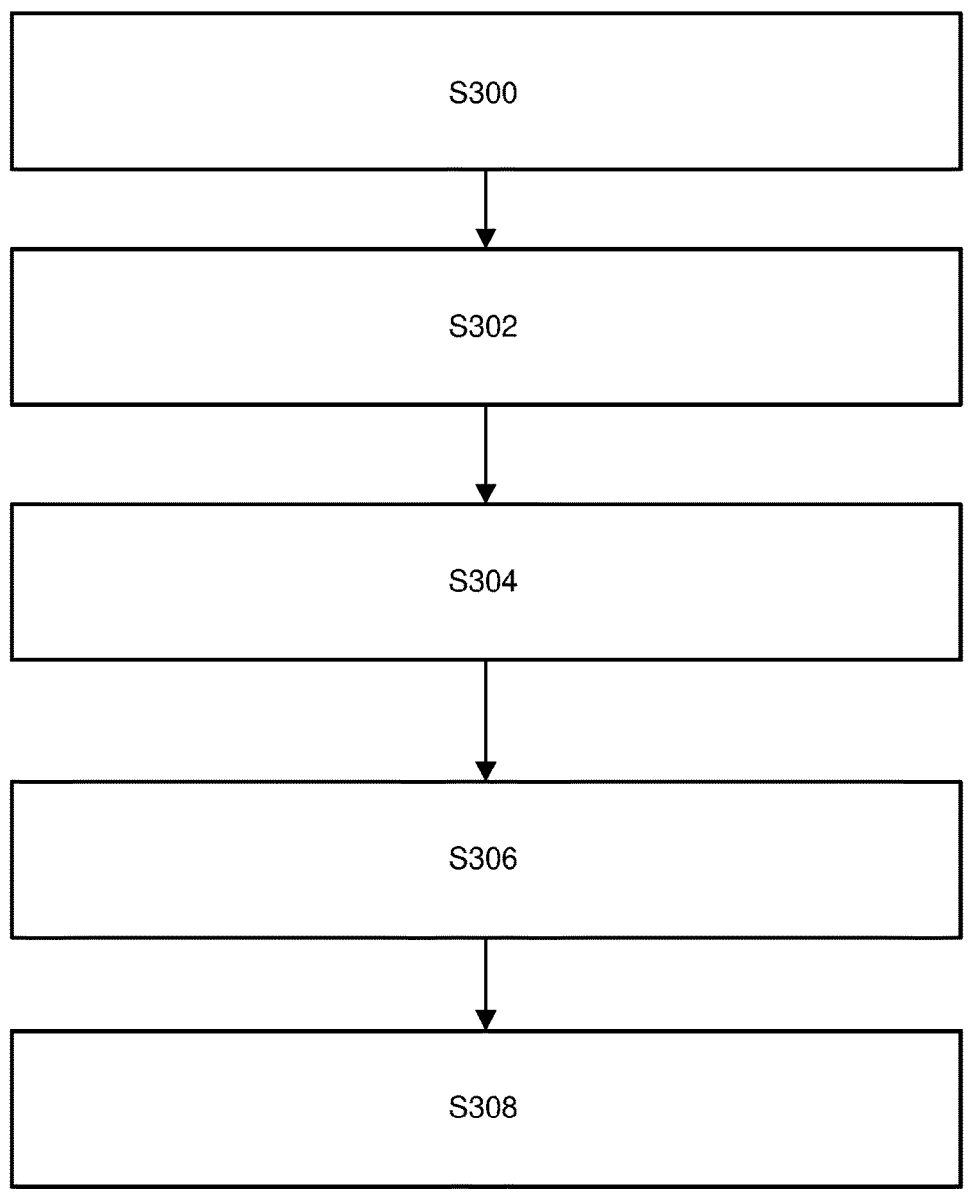
FIG. 3 shows an example method of data compression for data received from multiple data channels having different packet sizes.

FIG. 3 shows an example of the above algorithm.

S300—Determine Predefined a Number of Channels {C1, C2, . . . . Cm} According to Channels on a Corresponding Sensor, Each Channel Having a Defined Bit Size {n1, n2 . . . Nm}:

Step S300 illustrates the predetermined nature of the sensor channels and their corresponding bit widths. It will be understood that the 'determining' step may be performed prior any operation of an electronic device, e.g. the channels and their corresponding bit widths may be pre-programmed into the electronic device. Nevertheless, the number of channels, and the bit width of each respective channel, is determined and defined in a storage of the electronic device.

S302—Receive Sets of Data Words, Each Set Having a Corresponding Data Word, One for Each Channel:

At step S302, the data words are received by the sensor, i.e. as a set of data words as illustrated above in table 5.

S304—Restructure Data Words into Packet of Sizes According to the Defined Bit Size for Each Channel:

The data words are then restructured/partitioned in at S304, according to the channel to which they belong, into packets of the defined bit size.

S306—Insert an Indicator Bit within Packet at a Fixed Position, where a '1' Identifies the Start of a New Data Word, and a '0' Identifies the Continuation of a Data Word:

An indicator bit is then inserted (either a zero or one) within a defined position of each packet. The indicator bit identifies that a packet is either the beginning of a new data word (i.e. by a '1') or a continuation of a data word (i.e. a '0').

S308—Transfer the Packets as a Bit Stream of Data to a Receiver, and Demerge the Packets Once Transferred:

The data packets are merged together into a continuous bit stream, and transferred across a bus/interface to a receiver as said bit stream in step S308, to be received by the receiver. The receiver then decodes the bit stream using the defined sequence of bid widths for the multiple channels.

Additionally, the indicator bit may be inserted into any position within the above data stream. For example, the indicator bit may be appended to end of each packet, or inserted as the second bit in each packet, for example. In yet further example, in addition or alternatively to the above, the indicator bit can be inverted such that the bit width change in by 0 rather than a 1 (the rest of the sample indicators being ones).

Alternatively, the position of the indicator bit may also be predetermined to change location within each packet according to a predetermined order. In other words, the positon of the indicator bit changes based on a predefined sequence. Both the transmitter and receiver share this order of indicator bit positions. Using this confers the additional advantage that reverse engineering of the packet stream or the compression method is very difficult. Moreover, the data itself is further altered relative to the original data words; thus, advantageously, a degree of encryption may be achieved by altering the position of the indicator bit according to a predefined sequence.

It will be appreciated that the above multiple channel compression algorithm can be applied to any number of transfer scenarios for data transfer across a serial or parallel interface. Furthermore, the data need not have originated from a sensor, and it will be understood that the compression algorithm is applicable to all data including data derived from any number of sources.

FIG. 4 shows an example of a general electronic device system 400 configured to implement a compression algorithm, for example as shown in FIGS. 1-3. The electronic device comprises a user interface 412, a general purpose processor 414, and general storage 416, which may comprise persistent hard disc, flash, or solid state storage media, or volatile/non-persistent RAM storage, for example. The electronic device also comprises working memory that may comprise volatile storage e.g. comprising instructions for further processing of any received sensor measurement data.

The electronic device also comprises a sensor 402, which may be an ALS sensor for example. The sensor is coupled to hardware and/or a further processor 404 for carrying out the compression algorithm. For example, element 404 may be a chip such as an FPGA or ASIC having the compression algorithm hardcoded. The code element 404 is coupled to an interface, which transmits the compressed code, for example using FIFO as described above. The interface may be any suitable serial or parallel bus, for example an I²C or I³C interface. The interface is then coupled to a receiver 408 which receives the compressed data. The receiver may also comprise reconstruction code, or a suitable hardware element having configured to implement reconstruction code, such that the compressed code can be reconstructed into the originally received sensor data. Alternatively, the receiver may simply transfer the compressed data to the general processor 414 for processing of the compressed data. The skilled person will no doubt recognise that sensor 402 need not be an ALS sensor, and could be any number of external members which can detect and quantify some observable which can be then transferred as data.

No doubt many other effective alternatives will occur to the skilled person. It will be understood that the invention is not limited to the described embodiments and encompasses modifications apparent to those skilled in the art lying within the scope of the claims appended hereto.

The invention claimed is:

1. A method of compressing data for data transfer within an electronic device, the method comprising:
   receiving, at a first processing member of the electronic device, a plurality of data samples produced by a member of the electronic device, wherein the data samples comprise numerical bits;
   restructuring, by the first processing member, the plurality of data samples into a plurality of data packets;
   labelling each data packet with a sample indicator bit to indicate a plurality of groups across the plurality of data packets, wherein each group of the plurality of groups corresponds to a different respective data sample;
   transferring a bit stream comprising at least some of the plurality of data packets across an interface of the electronic device to a receiving member of the electronic device;
   decoding the bit stream, by a second processing member of the electronic device, to obtain at least some of the plurality of the data samples, the decoding being based at least in part on the sample indicator bits.

2. The method as claimed in claim 1, wherein the decoding comprises:
   identifying, based on the sample indicator bits, the plurality of groups of data packets representing the different respective data samples;
   removing the sample indicator bit from each data packet in order to obtain the plurality of data samples received originally from the member.

3. The method as claimed in claim 1, further comprising:
   prior to the restructuring, calculating numerical differences between each pair of adjacent data samples to obtain a plurality of difference values;
   restructuring, by the first processing member, the plurality of difference values instead of the data samples to obtain the plurality of data packets.

4. The method as claimed in claim 1, wherein the restructuring comprises, for each data sample:
   partitioning the numerical bits of the data sample into the fewest number of data packets required to represent information comprised in said data sample.

5. The method as claimed in claim 1, wherein each data packet of the plurality of data packets has a defined size.

6. The method as claimed in claim 5, further comprising:
   monitoring, by any one of the first processing member, second processing member, and receiving member of the electronic device, the restructuring of data samples into data packets to obtain an average number of data packets per data sample;
   dynamically setting the defined size of the plurality of data packets based on the average number of data packets per data sample.

7. The method as claimed in claim 1, wherein the data samples are representative of signals measured by a sensor member of the electronic device.

8. The method as claimed in claim 7, wherein the sensor member is an ambient light sensor.

9. The method as claimed in claim 1, wherein the member of the electronic device comprises a set of data channels which each produce a channel-specific data sample.

10. The method as claimed in claim 9, wherein the method further comprises:
    receiving the plurality of data samples produced by the set of data channels of the member;
    restructuring, by the first processing member, the plurality of data samples to obtain the plurality of data packets, the restructuring comprising for each data sample:
    restructuring said data sample into at least one data packet, wherein the at least one data packet has a defined size corresponding to a data channel of the set of data channels which produced said data sample.

11. A method as claimed in claim 1, wherein the sample indicator is inserted at a defined location within the data packet.

12. A method as claimed in claim 1, wherein the labelling further comprises:
    inserting the sample indicator into each data packet at a predefined location, where said predefined location changes according to a predefined sequence of locations.

13. A method as claimed in claim 1, wherein the interface of the electronic device is a serial peripheral interface.

14. A method as claimed in claim 1, wherein the interface of the electronic device is an I²C interface.

15. A method as claimed in claim 1, wherein each data sample is represented in binary.

16. A method as claimed in claim 1, wherein each data sample having a negative value is represented in two's complement binary form.

17. A method as claimed in claim 1, wherein the first processing member is a hardware element comprising a persistent configuration enabling said hardware element to carry out the restructuring and labelling.

18. A method as claimed in claim 1, wherein the sample indicator bit does not correspond to 1 bit.

19. A non-transitory data carrier carrying processor control code to, when running, implement the decoding of claim 1.

20. An apparatus comprising:
    a member configured to produce data samples;
    a first processing member, configured to receive a plurality of data samples produced by the member, wherein the data samples comprise numerical bits;
    an interface coupled to the first processing member and a receiving member, wherein the first processing member is further configured to:
    restructure the plurality of data samples into a plurality of data packets;
    label each data packet with a sample indicator bit to indicate a plurality of groups across the plurality of data packets, wherein each group of the plurality of groups corresponds to a different respective data sample;
    transfer a bit stream comprising at least some of the plurality of data packets across the interface to the receiving member; and a second processing member configured to decode the bit stream to obtain at least some of the plurality of the data samples, the decoding being based at least in part on the sample indicator bits.

* * * * *